United States Patent
Shimabukuro et al.

(10) Patent No.: US 10,818,545 B2
(45) Date of Patent: Oct. 27, 2020

(54) CONTACT VIA STRUCTURE INCLUDING A BARRIER METAL DISC FOR LOW RESISTANCE CONTACT AND METHODS OF MAKING THE SAME

(71) Applicant: SANDISK TECHNOLOGIES LLC, Addison, TX (US)

(72) Inventors: Seiji Shimabukuro, Yokkaichi (JP); Makoto Kamijo, Yokkaichi (JP); Tetsuya Kaneko, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 207 days.

(21) Appl. No.: 16/023,174

(22) Filed: Jun. 29, 2018

(65) Prior Publication Data

US 2020/0006131 A1    Jan. 2, 2020

(51) Int. Cl.
*H01L 21/768*    (2006.01)
*H01L 27/115*    (2017.01)
*H01L 23/532*    (2006.01)
*H01L 21/02*    (2006.01)
*H01L 21/311*    (2006.01)

(52) U.S. Cl.
CPC .. *H01L 21/76849* (2013.01); *H01L 21/76807* (2013.01); *H01L 21/76834* (2013.01); *H01L 21/76888* (2013.01); *H01L 23/53266* (2013.01); *H01L 27/115* (2013.01); *H01L 21/02175* (2013.01); *H01L 21/02244* (2013.01); *H01L 21/02252* (2013.01); *H01L 21/31111* (2013.01)

(58) Field of Classification Search
None
See application file for complete search history.

(56) References Cited

U.S. PATENT DOCUMENTS 6,522,013 B1 *  2/2003  Chen ............... H01L 21/76805
                                                257/751
6,613,664 B2 *  9/2003  Barth ............... H01L 21/76805
                                                257/E21.577

(Continued)

OTHER PUBLICATIONS

U.S. Appl. No. 15/720,556, filed Sep. 29, 2017, SanDisk Technologies LLC.

(Continued)

*Primary Examiner* — Lex H Malsawma
(74) *Attorney, Agent, or Firm* — The Marbury Law Group PLLC

(57) ABSTRACT

A first metal interconnect structure embedded in a first dielectric material layer includes a first metallic nitride liner containing a first conductive metal nitride and a first metallic fill material portion. A second metal interconnect structure embedded in a second dielectric material layer overlies the first dielectric material layer. The second metal interconnect structure includes a pillar portion having a straight sidewall and a foot portion adjoined to a bottom periphery of the pillar portion and laterally protruding from the bottom periphery of the pillar portion. The foot portion can be formed by oxidizing a top surface of the first metallic fill material portion, removing the oxidized portion after formation of a cavity through the second dielectric material layer, and depositing a second metallic nitride liner in a volume from which the oxidized portion is removed.

12 Claims, 12 Drawing Sheets

(56) References Cited

U.S. PATENT DOCUMENTS

| | | |
|---|---|---|
| 8,432,037 B2* | 4/2013 | Maekawa ......... H01L 21/76805 |
| | | 257/750 |
| 9,484,296 B2 | 11/2016 | Takahashi et al. |
| 9,515,085 B2 | 12/2016 | Rabkin et al. |
| 9,613,975 B2 | 4/2017 | Huang et al. |
| 9,728,499 B2 | 8/2017 | Shimabukuro et al. |
| 2002/0086523 A1* | 7/2002 | Barth ................ H01L 21/76852 |
| | | 438/637 |
| 2003/0100181 A1* | 5/2003 | Park .................. H01L 21/76805 |
| | | 438/639 |
| 2004/0102035 A1* | 5/2004 | Lee ................... H01L 21/76877 |
| | | 438/637 |
| 2005/0275110 A1* | 12/2005 | Maekawa ......... H01L 21/76814 |
| | | 257/760 |
| 2008/0012142 A1* | 1/2008 | Mehta ................ H01L 23/5329 |
| | | 257/762 |
| 2008/0203570 A1* | 8/2008 | Edelstein .......... H01L 21/76843 |
| | | 257/751 |
| 2012/0018889 A1* | 1/2012 | Vannier ............ H01L 23/53238 |
| | | 257/758 |
| 2014/0217612 A1* | 8/2014 | Bao .................... H01L 23/5256 |
| | | 257/775 |
| 2017/0338241 A1* | 11/2017 | Lee .................... H01L 29/66545 |
| 2018/0005878 A1* | 1/2018 | Liu .................... H01L 21/76849 |

OTHER PUBLICATIONS

U.S. Appl. No. 15/982,266, filed May 17, 2018, SanDisk Technologies LLC.

U.S. Appl. No. 16/020,817, filed Jun. 27, 2018, SanDisk Technologies LLC.

* cited by examiner

CONTACT VIA STRUCTURE INCLUDING A BARRIER METAL DISC FOR LOW RESISTANCE CONTACT AND METHODS OF MAKING THE SAME

FIELD

The present disclosure generally relates to semiconductor devices, and particularly to semiconductor devices including metal interconnect structures containing barrier metal discs for low resistance contact and methods of manufacturing the same.

BACKGROUND

Advanced semiconductor devices employ contact structures having small dimensions. Reduction in dimensions of contact via structures reduces the contact area and increases the contact resistance. Particularly, the decrease in the area of contact between a contact via structure and an underlying conductive structure increases the contact resistance. Increase in the contact resistance adversely impacts performance of a semiconductor circuit.

SUMMARY

According to an aspect of the present disclosure, a structure comprises a first metal interconnect structure embedded within a first dielectric material layer overlying a substrate, wherein the first metal interconnect structure comprises a first metallic nitride liner comprising a first conductive metal nitride and a first metallic fill material portion embedded within the first metallic nitride liner; and a second metal interconnect structure embedded within a second dielectric material layer overlying the first dielectric material layer, wherein the second metal interconnect structure comprises a second metallic nitride liner comprising a second conductive metal nitride and a second metallic fill material portion embedded within the second metallic nitride liner, wherein the second metallic nitride liner comprises a pillar portion having a straight sidewall and a foot portion adjoined to a bottom periphery of the pillar portion and laterally protruding from the bottom periphery of the pillar portion.

According to another aspect of the present disclosure, a method of forming a structure is provided, which comprises: forming a first metal interconnect structure within a first dielectric material layer overlying a substrate, wherein the first metal interconnect structure comprises a first metallic nitride liner comprising a first conductive metal nitride and a first metallic fill material portion embedded within the first metallic nitride liner; forming a metal oxide plate by oxidizing a surface region of the first metallic fill material portion; forming a second dielectric material layer over the metal oxide plate and the first dielectric material layer; forming a second cavity including a pillar cavity through the second dielectric material layer, wherein a top surface of the metal oxide plate is physically exposed underneath the second cavity; expanding the second cavity by removing the metal oxide plate selective to the first metal interconnect structure to form an expanded second cavity including a recess cavity adjoined to the pillar cavity; depositing a second conductive metal nitride in the expanded second cavity; depositing a second metallic fill material in remaining volumes of the expanded second cavity; and removing portions of the second metallic fill material and the second conductive metal nitride from above a horizontal plane including a top surface of the second dielectric material layer.

DETAILED DESCRIPTION

The embodiments of the present disclosure are directed to semiconductor devices including metal interconnect structures containing barrier metal discs having a foot portion for low resistance contact without increasing the contact area, and methods of manufacturing the same, the various aspects of which are discussed in detail herebelow.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

Figure 1:
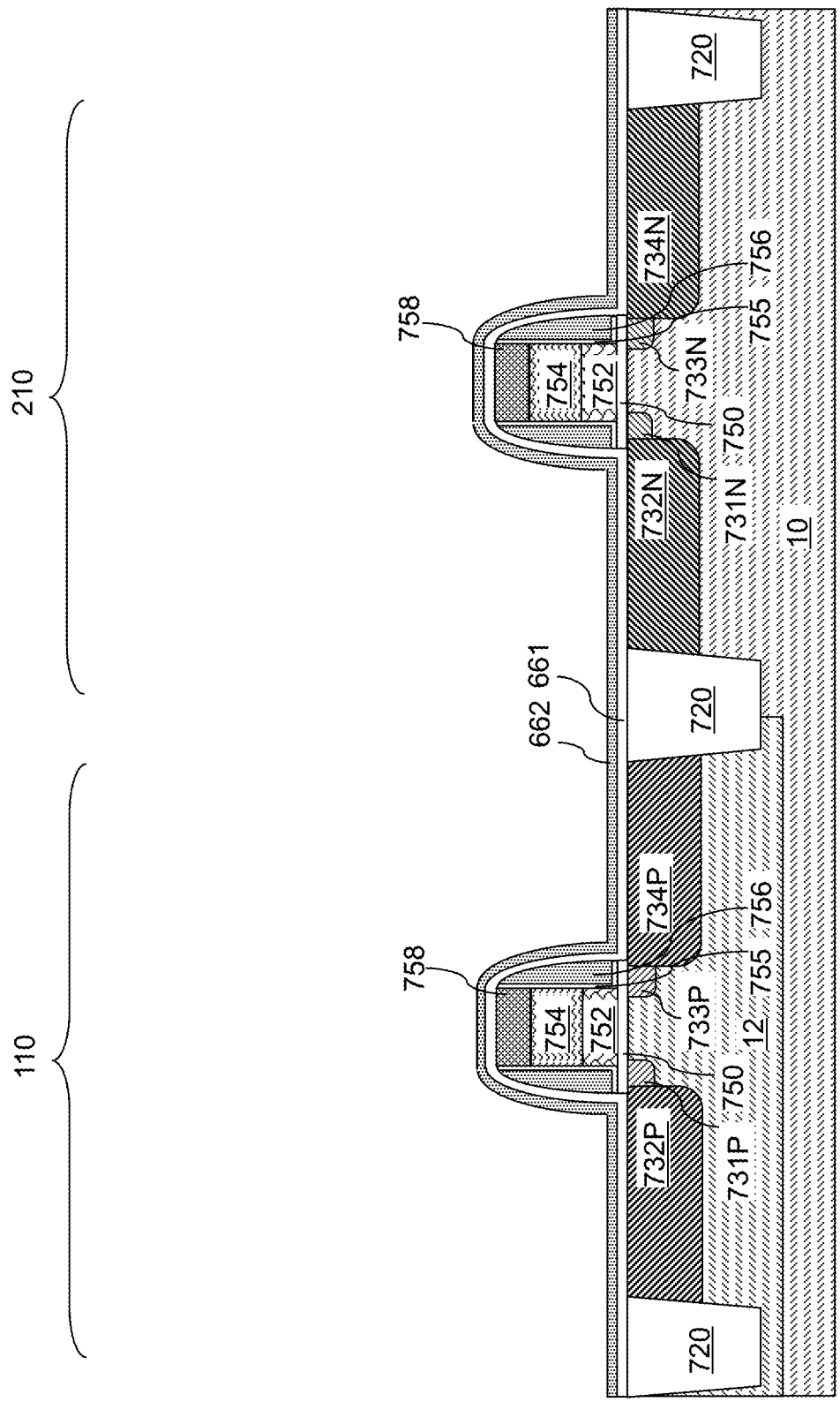
FIG. 1 is a vertical cross-sectional view of an exemplary structure after formation field effect transistors and dielectric liners on a semiconductor substrate according to the first embodiment of the present disclosure.

Referring to FIG. 1, an exemplary structure according to a first embodiment of the present disclosure is provided. The exemplary structure includes a substrate, which can be a semiconductor substrate (10, 12). As used herein, the semiconductor substrate (10, 12) may be a semiconductor wafer, and can include at least one elemental semiconductor material (e.g., single crystal silicon wafer or layer), at least one III-V compound semiconductor material, or at least one II-VI compound semiconductor material. The semiconductor substrate (10, 12) may have one or more doped wells 12 in its top surface and/or one or more semiconductor layers located over its top surface. The semiconductor substrate (10, 12) can include a substrate semiconductor layer 10 having a doping of a first conductivity type (such as p-type or n-type), and at least one doped well 12 having a doping of a second conductivity type that is the opposite of the first conductivity type. The substrate semiconductor layer 10 can be provided as a semiconductor material layer over a commercially available semiconductor substrate (e.g., silicon wafer) or can be a top portion of the bulk semiconductor substrate (e.g., silicon wafer). Alternatively, the substrate semiconductor layer 10 may comprise a semiconductor layer formed on a top surface of an insulating or conductive substrate, such as a silicon-on-insulator type substrate.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

The substrate semiconductor layer 10 can include a single crystalline semiconductor material such as single crystalline silicon. The atomic concentration of first conductivity type dopants in the substrate semiconductor layer 10 can be in a range from $1.0 \times 10^{14}/cm^{3}$ to $1.0 \times 10^{17}/cm^{3}$, although lesser and greater atomic concentrations can also be employed. The doped well 12 can be formed by implanting dopants of the second conductivity through the top surface 7 of the semiconductor substrate into a surface portion of the substrate semiconductor layer 10. The net dopant concentration (i.e., the atomic concentration of the second conductivity type dopants less the atomic concentration of the first conductivity type dopants) in the doped well 12 can be in a range from $1.0 \times 10^{14}/cm^{3}$ to $1.0 \times 10^{17}/cm^{3}$, although lesser and greater atomic concentrations can also be employed.

Generally, a p-doped semiconductor material region and an n-doped semiconductor material region are formed in the semiconductor substrate (10, 12). At least one semiconductor device can be formed on the semiconductor substrate (10, 12). The at least one semiconductor device can be any semiconductor device known in the art. For example, the at least one semiconductor device can include at least one p-type field effect transistor 110 and at least one n-type filed effect transistor 210. In the present disclosure, a p-type field effect transistor 110 and an n-type filed effect transistor 210 are employed as representative examples of the at least one semiconductor device that can be formed on the semiconductor substrate (10, 12). However, it is understood that any other type of semiconductor device may be formed on the semiconductor substrate (10, 12) in addition to, or in lieu of, the p-type field effect transistor 110 and the n-type field effect transistor 210. Further, multiple instances of each type of the field effect transistors (110, 210) can be formed on the semiconductor substrate (10, 12). Further, multiple types of field effect transistors having different gate dielectric thicknesses may be formed on the semiconductor substrate (10, 12).

The device region including the n-doped semiconductor material region within the semiconductor substrate (10, 12) is herein referred to as a p-type field effect transistor region or a PMOS region. The device region including the p-doped semiconductor material region within the semiconductor substrate (10, 12) is herein referred to as an n-type field effect transistor region or an NMOS region. In the illustrated example, the substrate semiconductor layer 10 can have a p-type doping and the doped well can be 12 is formed with an n-type doping. Thus, the substrate semiconductor layer 10 corresponds to the p-doped semiconductor material region and the doped well 12 corresponds to the n-doped semiconductor material region. Alternatively, the substrate semiconductor layer 10 can have an n-type doping and the doped well can be formed with a p-type doping. In this case, the doped well corresponds to the p-doped semiconductor material region and the substrate semiconductor layer 10 corresponds to an n-doped semiconductor material region. While the present disclosure is described employing an embodiment in which the p-doped semiconductor material region comprises the substrate semiconductor layer 10 and the n-doped semiconductor material region comprises a doped well 12, embodiments are expressly contemplated in which the p-doped semiconductor material region comprises a doped well and the n-doped semiconductor material region comprises a substrate semiconductor layer.

Shallow trench isolation structures 720 can be formed in upper portions of the semiconductor substrate (10, 12) to provide electrical isolation among neighboring devices. For example, shallow trenches can be formed around each device region that requires electrical isolation from neighboring device regions, and can be filled with a dielectric material such as silicon oxide. Excess portions of the dielectric material can be removed from above the top surface of the semiconductor substrate (10, 12) by a planarization process such as chemical mechanical planarization. Remaining portions of the dielectric material in the shallow trenches constitute the shallow trench isolation structures 720.

A gate dielectric layer, a semiconductor material layer, a metallic gate material layer, and a gate cap dielectric layer can be sequentially deposited on the top surface 7 of the semiconductor substrate (10, 12). The gate dielectric layer includes a gate dielectric material such as silicon oxide and/or a dielectric metal oxide. The semiconductor material layer can include a doped or undoped semiconductor material such as doped or undoped polysilicon or amorphous silicon. The metallic gate material layer includes a metal or metal alloy gate material such as tungsten, tungsten silicide, titanium silicide, etc. The gate cap dielectric layer includes a dielectric material such as silicon nitride.

The gate cap dielectric layer, the metallic gate material layer, and the semiconductor material layer can be patterned, for example, by application and patterning of a photoresist layer thereabove, and by transferring the pattern in the photoresist layer through the gate cap dielectric layer, the metallic gate material layer, and the semiconductor material layer employing an anisotropic etch process. The anisotropic etch process can stop on the top surface of the gate dielectric layer. Patterned portions of the gate cap dielectric layer constitute gate cap dielectrics 758, patterned portions of the metallic gate material layer constitute metallic gate electrode portions 754, and patterned portions of the semiconductor material layer constitute semiconductor gate electrode portions 752. Each stack of a semiconductor gate electrode portion 752, a metallic gate electrode portion 754, and a gate cap dielectric 758 constitutes a gate stack (752, 754, 758). The photoresist layer can be subsequently removed, for example, by ashing. The semiconductor gate electrode portions 752 in the p-type field effect transistor region can include a p-doped semiconductor material, while semiconductor gate electrode portions 752 in the n-type field effect transistor region can include an n-doped semiconductor material.

In one embodiment, the PMOS and/or NMOS transistors have a lightly doped drain-source (LDD) configuration. In this embodiment, a first block level photoresist layer can be applied and patterned to cover the n-type field effect transistor region while not covering the p-type field effect transistor region. P-type dopants can be implanted into surface portions of the semiconductor substrate (10, 12) in the p-type field effect transistor region that are not masked by the first block level photoresist layer or the gate stacks (752, 754, 758). Surface portions of the semiconductor substrate (10, 12) in the p-type field effect transistor region that are implanted with the p-type dopants form p-doped extension regions (731P, 733P). The p-doped extension regions (731P, 733P) include a first source extension region 731P and a first drain extension region 733P. Thus, the first source extension region 731P can be a p-doped source extension region, and the first drain extension region 733P can be a p-doped drain extension region. The first source extension region 731P and the first drain extension region 733P form p-n junctions with an underlying portion of the semiconductor substrate (10, 12), which can be, for example, the doped well 12 having an n-type doping. The first block level photoresist layer can be subsequently removed, for example, by ashing.

A second block level photoresist layer can be applied and patterned to cover the p-type field effect transistor region while not covering the n-type field effect transistor region. N-type dopants can be implanted into surface portions of the semiconductor substrate (10, 12) in the n-type field effect transistor region that are not masked by the second block level photoresist layer or the gate stacks (752, 754, 758). Surface portions of the semiconductor substrate (10, 12) in the n-type field effect transistor region that are implanted with the n-type dopants form n-doped extension regions (731N, 733N). The n-doped extension regions (731N, 733N) include a second source extension region 731N and a second drain extension region 733N that have an n-type doping. Thus, the second source extension region 731N can be an n-doped source extension region, and the second drain extension region 733N can be an n-doped drain extension region. The second source extension region 731N and the second drain extension region 733N form p-n junctions with an underlying portion of the semiconductor substrate (10, 12), which can be, for example, the substrate semiconductor layer 10 having a p-type doping. The second block level photoresist layer can be subsequently removed, for example, by ashing. Alternatively, if the NMOS and/or PMOS transistors do not have the LDD configuration, then the above implantation steps for forming the extension regions can be omitted.

A conformal gate dielectric liner including a first dielectric material such as silicon oxide can be deposited by a conformal deposition process. The conformal gate dielectric liner can have a thickness in a range from 2 nm to 10 nm, although lesser and greater thicknesses can also be employed. A continuous gate spacer dielectric layer including a second dielectric material such as silicon nitride can be subsequently deposited over the conformal gate dielectric liner. The thickness of vertical portions of the continuous gate spacer dielectric layer can be in a range from 5 nm to 50 nm, although lesser and greater thicknesses can also be employed. An anisotropic etch process can be performed to remove horizontal portions of the continuous gate spacer dielectric layer and the conformal gate dielectric liner. Remaining portions of the continuous gate spacer dielectric layer constitute gate dielectric spacers 756, and remaining portions of the conformal gate dielectric liner constitute gate dielectric liners 755. Portions of the gate dielectric layer that are not covered by the gate stacks (752, 754, 758), the gate dielectric liners 755, or the gate dielectric spacers 756 can be removed by a terminal portion of the anisotropic etch process. The anisotropic etch process can stop on the top surface of the semiconductor substrate (10, 12). Each remaining portion of the gate dielectric layer constitutes a gate dielectric 750.

A third block level photoresist layer can be applied over the exemplary structure, and can be patterned to cover the portion of the semiconductor substrate (10, 12) in the p-type field effect transistor region without covering the portion of the semiconductor substrate (10, 12) in the n-type field effect transistor region. N-type dopants can be implanted into unmasked portions of the exemplary structure to form n-doped active regions (732N, 734N). The n-doped active regions (732N, 734N) can include a second source region 732N and a second drain region 734N. The dopant concentration of the n-type dopants in the second source region 732N, and the second drain region 734N can be in a range from $1.0 \times 10^{20}/\text{cm}^3$ to $1.0 \times 10^{21}/\text{cm}^3$, although lesser and greater dopant concentrations can also be employed. The third block level photoresist layer can be subsequently removed, for example, by ashing.

A fourth block level photoresist layer can be applied over the exemplary structure, and can be patterned to cover the portion of the semiconductor substrate (10, 12) and overlying layers in the n-type field effect transistor region without covering the portion of the semiconductor substrate (10, 12) and the overlying layers in the p-type field effect transistor region. P-type dopants can be implanted into unmasked portions of the exemplary structure to form p-doped active regions (732P, 734P) in the implanted surface portions of the semiconductor substrate (10, 12) employing the second photoresist layer 757 as an implantation mask. The p-doped active regions (732P, 734P) can include a first source region 732P and a first drain region 734P. The dopant concentration of the p-type dopants in the first source region 732P, and the first drain region 734P can be in a range from $1.0 \times 10^{20}/\text{cm}^3$ to $1.0 \times 10^{21}/\text{cm}^3$, although lesser and greater dopant concentrations can also be employed. The fourth block level photoresist layer can be subsequently removed, for example, by ashing.

Dielectric liners (661, 662) can be deposited over the gate structures and the semiconductor substrate (10, 12). For example, a silicon oxide liner 661 can be deposited on, and over, each of the field effect transistors (110, 210). The silicon oxide liner 661 includes silicon oxide and can be formed by a conformal deposition process. For example, the silicon oxide liner 661 can be formed by decomposition of a silicon oxide precursor such as tetraethylorthosilicate (TEOS) in a low pressure chemical vapor deposition (LP-CVD) process. The thickness of the silicon oxide liner 661 can be in a range from 1 nm to 10 nm, although lesser and greater thicknesses can also be employed. The silicon oxide liner 661 promotes adhesion of a silicon nitride liner to be subsequently formed.

A silicon nitride liner 662 can be deposited on the top surface of the silicon oxide liner 661. The silicon nitride liner 662 can be deposited by plasma enhanced chemical vapor deposition, which induces incorporation of hydrogen into the silicon nitride liner 662. The thickness of the horizontal portions of the silicon nitride liner 662 can be in a range from 10 nm to 100 nm, such as from 20 nm to 50 nm, although lesser and greater thicknesses can also be employed. In one embodiment, multiple silicon nitride liners applying different types and/or levels of stress to underlying field effect transistors may be formed in lieu of a single silicon nitride liner 662.

Figure 2:
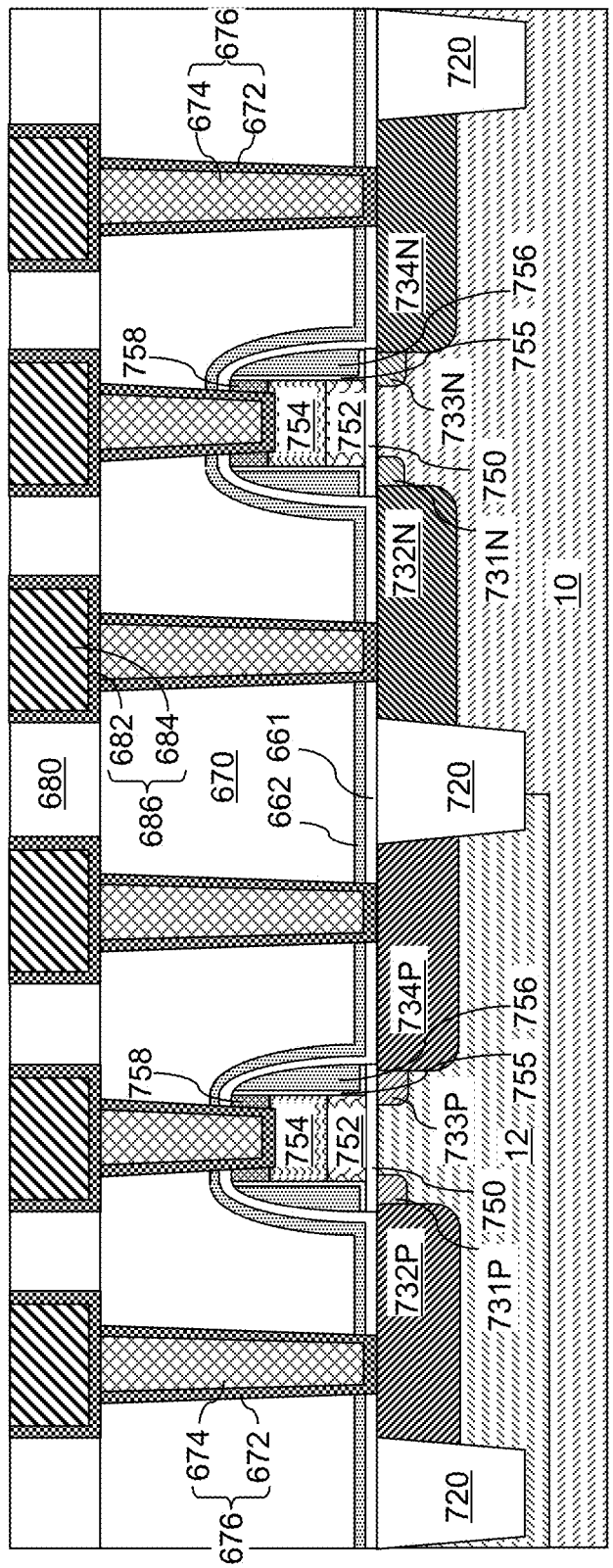
FIG. 2 is a vertical cross-sectional view of the exemplary structure after formation of a planarization dielectric layer, contact via structures, a first dielectric material layer, and first metal interconnect structures according to first embodiment of the present disclosure.
Figure 11:
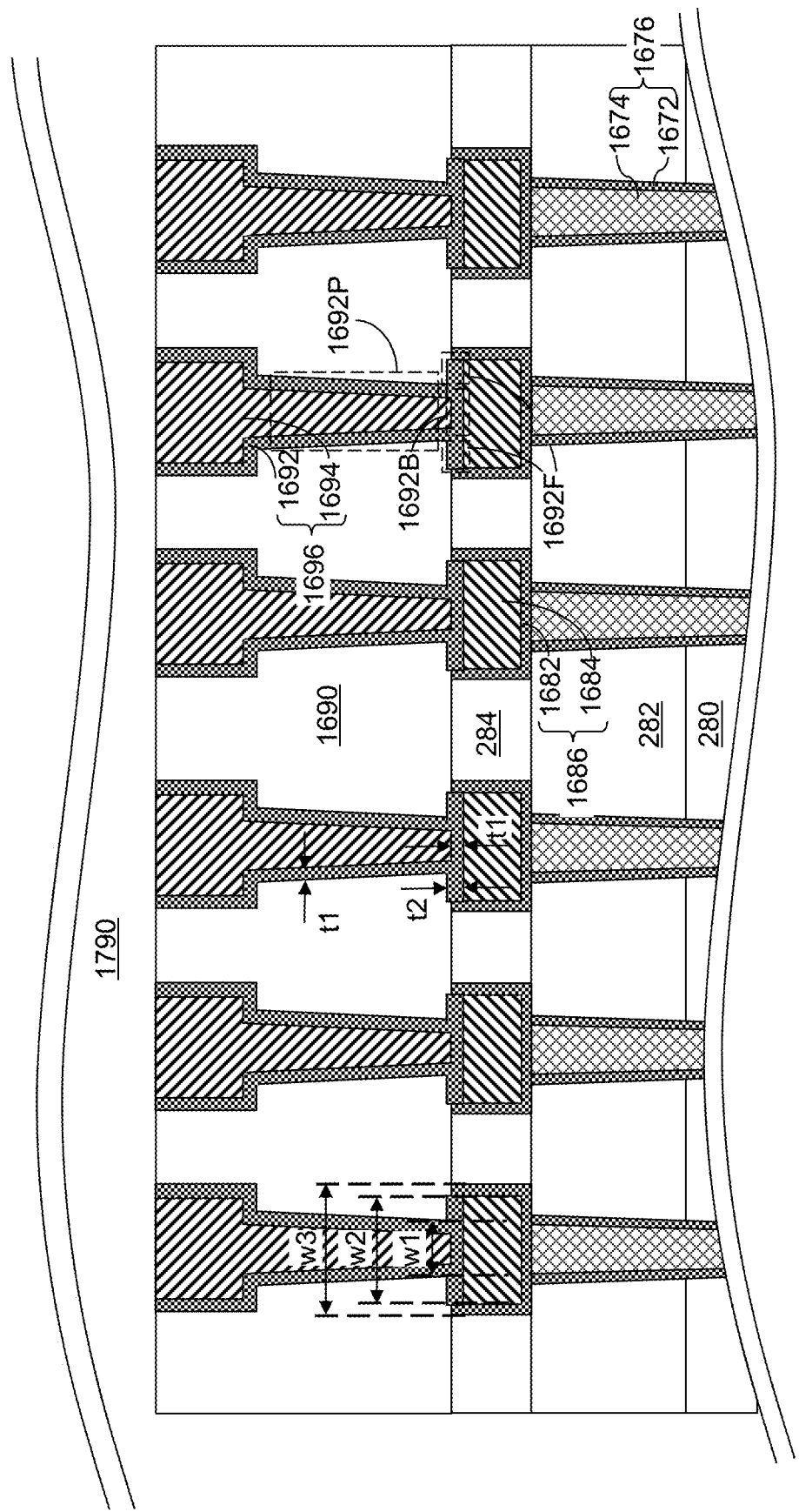
FIG. 11 is a vertical cross-sectional view of a second embodiment of the exemplary structure in which the first and second metal interconnect structures of the present disclosure are employed above a three-dimensional memory device according to the second embodiment of the present disclosure.

Referring to FIG. 2, a planarization dielectric layer FIG. 11, contact via structures 676, a first dielectric material layer 680, and first metal interconnect structures 686 can be formed over the dielectric liners (661, 662). For example, a dielectric material is subsequently deposited over the silicon nitride liner 662. The deposited dielectric material is herein referred to as a planarization dielectric material. The planarization dielectric material includes a planarizable dielectric material such as undoped silicate glass or doped silicate glass. Alternatively, the planarization dielectric material can include a self-planarizing dielectric material such as spin-on glass (SOG). A planar top surface of the dielectric material is provided by a planarization process such as chemical mechanical planarization, or by self-planarizing property of the dielectric material. The layer of planarization dielectric material is herein referred to as a planarization dielectric layer 670. In case the planarization dielectric material includes deposited or spin-coated silicon oxide material, the planarization dielectric layer 670 includes typical impurities contained in a deposited silicon oxide material. For example, the planarization dielectric layer 670 can include hydrogen atoms at an atomic concentration greater than 3 part per million and carbon atoms at an atomic concentration greater than 1 part per million, which can be caused by incorporation of impurities during thermal decomposition of tetraethylorthosilicate (TEOS) or by incorporation of a residual solvent material during application of a spin-on-glass material.

A photoresist layer can be applied over the planarization dielectric layer 670, and can be lithographically patterned to form contact openings in areas in which contact via structures are to be subsequently formed. For example, openings can be formed in areas of the p-doped active regions (732P, 734P), the n-doped active regions (732N, 734N), and the gate electrodes (752, 754) of the various field effect transistors (110, 210). Various contact via cavities can be formed by anisotropically etching portions of the planarization dielectric layer 670, the silicon nitride liner 662, the silicon oxide liner 661, and the gate cap dielectric portions 758. The various contact via cavities can be simultaneously formed by an anisotropic etch process that employs the photoresist layer as an etch mask. The various contact via cavities include p-type active region via cavities that are formed over the p-doped active regions (732P, 734P), n-type active region via cavities that are formed over the n-doped active regions (732N, 734N), and gate contact via cavities that are formed over the gate electrodes (752, 754).

The photoresist layer can be removed from above the planarization dielectric layer 670, for example, by ashing. Various contact via structures 676 are formed in the various via cavities by deposition of at least one conductive material therein. For example, a metallic barrier material such as titanium, TiN, TaN, and/or WN can be deposited in the various via cavities. Subsequently, a metallic fill material such as W, Cu, Al, Ru, Co, and/or Mo can be deposited in remaining volumes of the various via cavities. Excess portions of the metallic fill material and the metallic barrier material can be removed from above the horizontal plane including the top surface of the planarization dielectric layer 670 by a planarization process such as chemical mechanical planarization. Each remaining portion of the metallic barrier material constitutes a metallic barrier liner 672. Each remaining portion of the metallic fill material constitutes a metallic fill material portion 674. Each adjoining pair of a metallic barrier liner 672 and a metallic fill material portion 674 constitutes a contact via structure 676.

The contact via structures 676 include first active region contact via structures (e.g., source and drain electrodes) that are formed directly on a respective one of the p-doped active regions (732P, 734P), second active region contact via structures (e.g., source and drain electrodes) that are formed directly on a respective one of the n-doped active regions (732N, 734N), and gate contact via structures (e.g., gate contacts) that are formed directly on a respective one of the gate electrodes (752, 754).

A first dielectric material layer 680 can be formed over the planarization dielectric layer 670 and the contact via structures 676. The first dielectric material layer 680 includes a dielectric material such as undoped silicate glass, a doped silicate glass, or porous or non-porous organosilicate glass. The first dielectric material layer 680 can be deposited by chemical vapor deposition or spin coating. The thickness of the first dielectric material layer 680 can be in a range from 50 nm to 500 nm, such as from 100 nm to 300 nm, although lesser and greater thicknesses can also be employed.

First cavities can be formed through the first dielectric material layer 680. In one embodiment, the first cavities may be line trenches that extend along any horizontal direction. The line trenches may, or may not, be parallel among one another. For example, a photoresist layer can be applied over the first dielectric material layer 680, and can be lithographically patterned to form openings therein. The pattern in the photoresist layer can be transferred through the first dielectric material layer 680 by an anisotropic etch process employing the patterned photoresist layer as an etch mask. Unmasked portions of the first dielectric material layer 680 is etched by the anisotropic etch process to form the line trenches. Top surfaces of the contact via structures 676 can be physically exposed at the bottom of the line trenches. The photoresist layer can be removed from above the first dielectric material layer 680, for example, by ashing.

Various first metal interconnect structures 686 are formed in the various via cavities by deposition of at least one conductive material therein. For example, a metallic barrier material such as titanium, TiN, TaN, and/or WN can be deposited in the various via cavities. Subsequently, a first metallic fill material such as W, Cu, Ru, Co, and/or Mo can be deposited in remaining volumes of the various via cavities. Excess portions of the first metallic fill material and the metallic barrier material can be removed from above the horizontal plane including the top surface of the first dielectric material layer 680 by a planarization process such as chemical mechanical planarization. Each remaining portion of the metallic barrier material constitutes a first metallic nitride liner 682. In one embodiment, each of the first metallic nitride liners 682 can consist essentially of at least one first conductive metal nitride selected from WN, TiN, and TaN. Each remaining portion of the first metallic fill material constitutes a first metallic fill material portion 684. In one embodiment, each of the first metallic fill material portions 684 can comprise, and/or consist essentially of, at least one element selected from tungsten, copper, aluminum, ruthenium, and cobalt. In one embodiment, the first metallic fill material portions 684 can consist essentially of tungsten.

Each adjoining pair of a first metallic nitride liner 682 and a first metallic fill material portion 684 constitutes a first metal interconnect structure 686. Each first metallic fill material portion 684 can be embedded within the first metallic nitride liner 682 of the same first metal interconnect structure 686. At least one of the first metal interconnect structures 686 can be electrically connected to a node of the field effect transistors (110, 210) through the respective contact via structure 676.

In the illustrated example, the contact via structures 676 are formed at a substrate contact level and contacts various nodes of semiconductor devices located within the semiconductor substrate (10, 12). Generally, the contact via structures 676 can be formed at any via level of a metal interconnect assembly embedded within multiple dielectric material layers. For example, the contact via structures 676 may be formed at a first via level, a second via level, etc. Further, the first metal interconnect structures 686 are formed at a first metal line level. However, the first metal interconnect structures 686 can be formed at any of the metal line levels within the metal interconnect assembly such as a second metal line level, a third metal line level, etc. In addition, while the present disclosure is described employing an embodiment in which the contact via structures 676 and the first metal interconnect structures 686 are formed employing two single damascene processes in which cavities for the contact via structures 676 and cavities for the first metal interconnect structures 686 are formed separately, and conductive materials are deposited in the two types of cavities at two separate deposition steps, embodiments employing a dual damascene processing scheme are expressly contemplated. In this case, via cavities and line cavities are formed in two separate patterning processes to form integrated line and via cavities, and are simultaneously filled by at least one conductive material to form integrated line and via structures. In this case, the first metal interconnect structures 686 can be integrated line and via structures including a line portion embedded within the first dielectric material layer 680 and at least one via portion embedded within the planarization dielectric layer 670. In such cases, the planarization dielectric layer 670 and the first dielectric material layer 680 can be formed as a single layer in a single deposition process.

In one embodiment, top surfaces of the first metallic nitride liners 682 and the first metallic fill material portions 684 can be coplanar with the top surface of the first dielectric material layer 680. The thickness of the first metallic nitride liners 682 can be in a range from 1 nm to 15 nm, such as from 2 nm to 8 nm, although lesser and greater thicknesses can also be employed.

Figure 3:
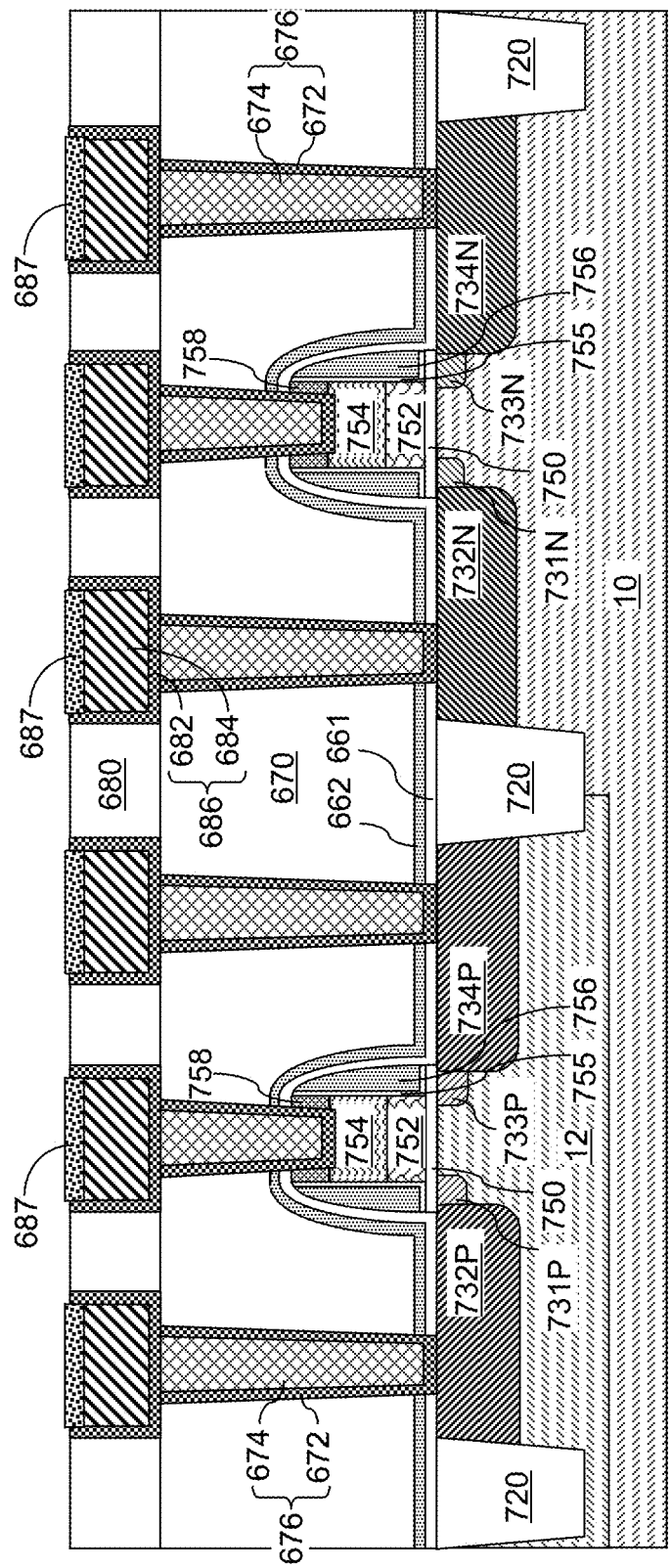
FIG. 3 is a vertical cross-sectional view of the exemplary structure after formation of metal oxide plates by plasma oxidation according to first embodiment of the present disclosure.

Referring to FIG. 3, an oxidation process, such as a plasma oxidation process is performed to oxidize surface regions of the first metallic fill material portions 684. Physically exposed surface regions of the first metallic fill material portions 684 are oxidized by an oxygen containing ambient, such as a plasma treatment in an oxygen-containing plasma during the plasma oxidation process. Metal oxide plates 687 are formed by the plasma oxidation of the surface regions of the first metallic fill material portions 684 during the plasma oxidation process. The oxygen-containing plasma of the plasma oxidation process can be generated by flowing an oxygen-containing gas species such as $O_2$, $O_3$, and/or nitric or nitrous oxide into a plasma process chamber and applying RF power. The magnitude of the RF power and the duration of the plasma oxidation process can be selected such that the thickness of the metal oxide plates 687 can be in a range from 0.8 nm to 6 nm such as from 1.2 nm to 4 nm, although lesser and greater thicknesses can also be employed. In one embodiment, the first metallic fill material portions 684 can comprise, and/or consist essentially of, at least one metal element selected from W, Cu, Ru, Co, and/or Mo, and the metal oxide plates 687 can comprise, and/or consist essentially of, an oxide of the at least one metal element, i.e., tungsten oxide, copper oxide, aluminum oxide, ruthenium oxide, cobalt oxide, and/or molybdenum oxide. In one embodiment, the first metallic fill material portion 684 can consist essentially of tungsten, and the metal oxide plates 687 can consist essentially of tungsten oxide.

Each metal oxide plate 687 can have a uniform thickness throughout. In one embodiment, each metal oxide plate 687 can have an outer periphery that contacts a periphery on inner sidewalls of a respective first metallic nitride liner 682. Thus, each first metallic fill material portion 684 can be encapsulated by a first metallic nitride liner 682 and a metal oxide plate 687. Due to conversion of the surface regions of the first metallic fill material portions 684, the first metallic fill material portions 684 are thinned during the plasma oxidation process. Thus, the top surfaces of the first metallic fill material portions 684 are recessed below the horizontal plane including the top surface of the first dielectric material layer 680.

Figure 4:
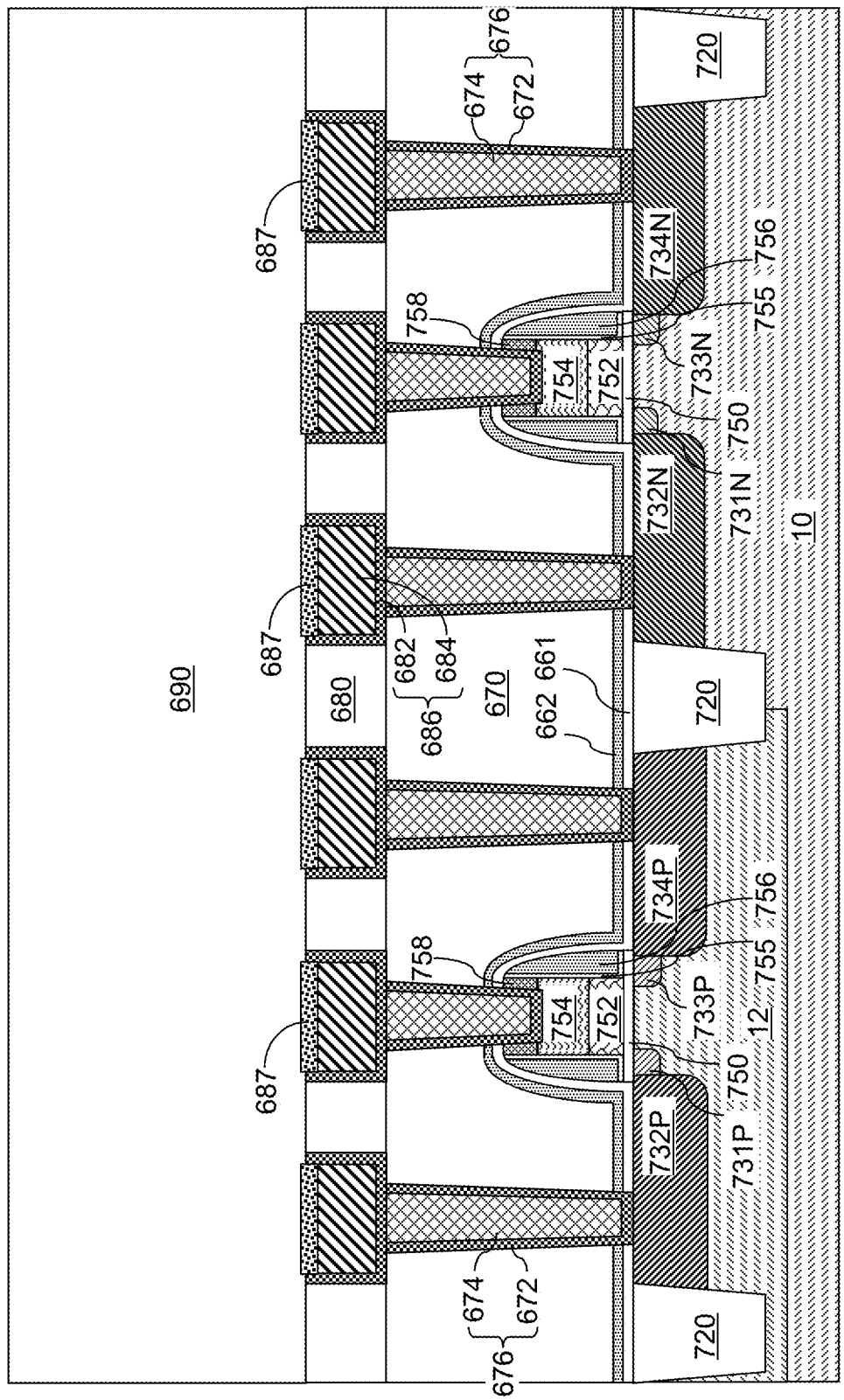
FIG. 4 is a vertical cross-sectional view of the first region of the exemplary structure after formation of a second dielectric material layer according to first embodiment of the present disclosure.

Referring to FIG. 4, a second dielectric material layer 690 is formed over the first dielectric material layer 680 and over the metal oxide plates 687. In one embodiment, the second dielectric material layer 690 can contact physically exposed top surfaces of the first metallic nitride liners 682 that laterally surround the metal oxide plates 687. The second dielectric material layer 690 includes a dielectric material such as undoped silicate glass, a doped silicate glass, or porous or non-porous organosilicate glass. The second dielectric material layer 690 can be deposited by chemical vapor deposition or spin coating. The thickness of the second dielectric material layer 690 can be in a range from 100 nm to 800 nm, such as from 200 nm to 500 nm, although lesser and greater thicknesses can also be employed.

Figure 5:
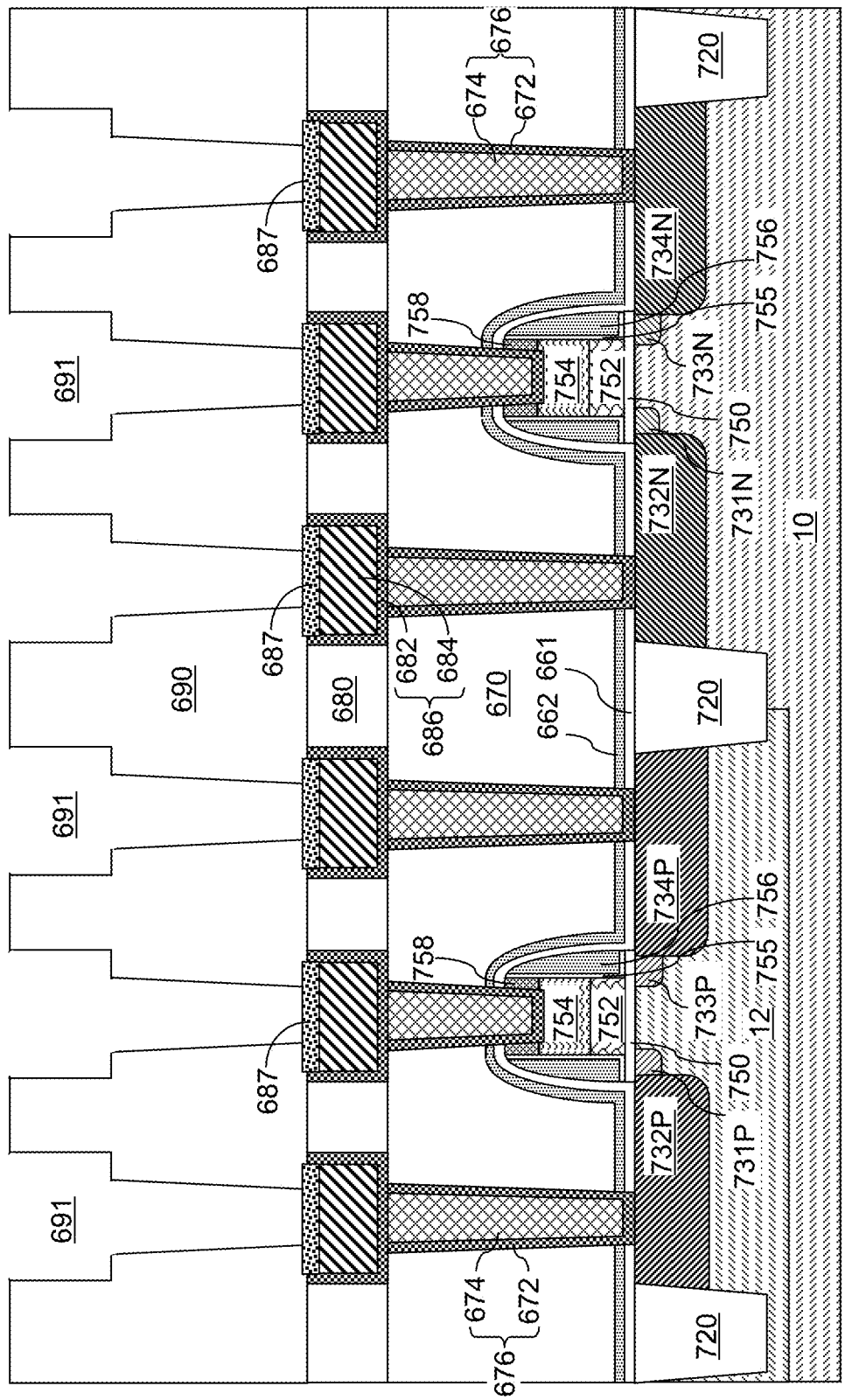
FIG. 5 is a vertical cross-sectional view of the first region of the exemplary structure after formation of second cavities in the second dielectric material layer according to first embodiment of the present disclosure.

Referring to FIG. 5, second cavities 691 can be formed through the second dielectric material layer 690. The second cavities 691 may be integrated line and via cavities formed by a dual damascene patterning process. Alternatively, the second cavities 691 may be via cavities including straight edges extending from the top surface of the second dielectric material layer 690 to the bottom surface of the second dielectric material layer 690 and having a greater vertical dimension than a maximum lateral dimension. Yet alternatively, the second cavities 691 may be line cavities including straight edges extending from the top surface of the second dielectric material layer 690 to the bottom surface of the second dielectric material layer 690 and having a lesser vertical dimension than a maximum lateral dimension.

In case the second cavities 691 include integrated line and via cavities, such integrated line and via cavities may be formed by applying a first photoresist layer over the second dielectric material layer 690, forming a first set of openings, and transferring the pattern of the first set of openings through an upper portion of the second dielectric material layer 690 by a first anisotropic etch process, removing the first photoresist layer, applying a second photoresist layer over the second dielectric material layer 690, forming a second set of openings having an areal overlap with the first set of openings, and transferring the pattern of the second set of openings partly or fully through the second dielectric material layer 690 by a second anisotropic etch process, and removing the second photoresist layer. In this case, regions of the second dielectric material layer 690 in which the areas of the first set of openings and the second set of openings overlap can be etched through the entire depth of the second dielectric material layer 690. Regions of the second dielectric material layer 690 in which the areas of the first set of openings and the second set of openings do not overlap can be etched only through an upper portion the second dielectric material layer 690.

In one embodiment, the areas of the first set of openings correspond to areas of line structures to be subsequently formed and the areas of the second set of openings correspond to areas of via structures to be subsequently formed. In this case, the areas of the second set of openings can be entirely within the areas of the first set of openings, and the integration scheme is referred to as a line-first dual damascene integration scheme. In another embodiment, the areas of the first set of openings correspond to areas of via structures to be subsequently formed and the areas of the second set of openings correspond to areas of line structures to be subsequently formed. In this case, the areas of the first set of openings can be entirely within the areas of the second set of openings, and the integration scheme is referred to as a via-first dual damascene integration scheme. If a via-first dual damascene integration scheme is employed, the first photoresist layer may be lithographically re-exposed and re-developed to provide the pattern of the set of second openings instead of removing the first photoresist layer and applying and patterning the second photoresist layer.

While the present disclosure is described employing an embodiment in which the second cavities 691 are formed as line and via cavities, embodiments are expressly contemplated herein in which the second cavities 691 are formed as via cavities or line cavities. A top surface of a metal oxide plate 687 can be physically exposed underneath each second cavity 691. A center portion of a metal oxide plate 687 can be physically exposed at the bottom of each second cavity 691, while a peripheral portion of the metal oxide plate 687 is not physically exposed at the bottom of each second cavity 691. In one embodiment, the entirety of a closed periphery (i.e., a periphery having a closed two-dimensional shape) of each metal oxide plate 687 contacting an inner periphery of a respective one of the first metallic nitride liners 682 can be covered by the second dielectric material layer 690, and thus, laterally spaced from the periphery of the bottom surface of an overlying second cavity 691.

Figure 6:
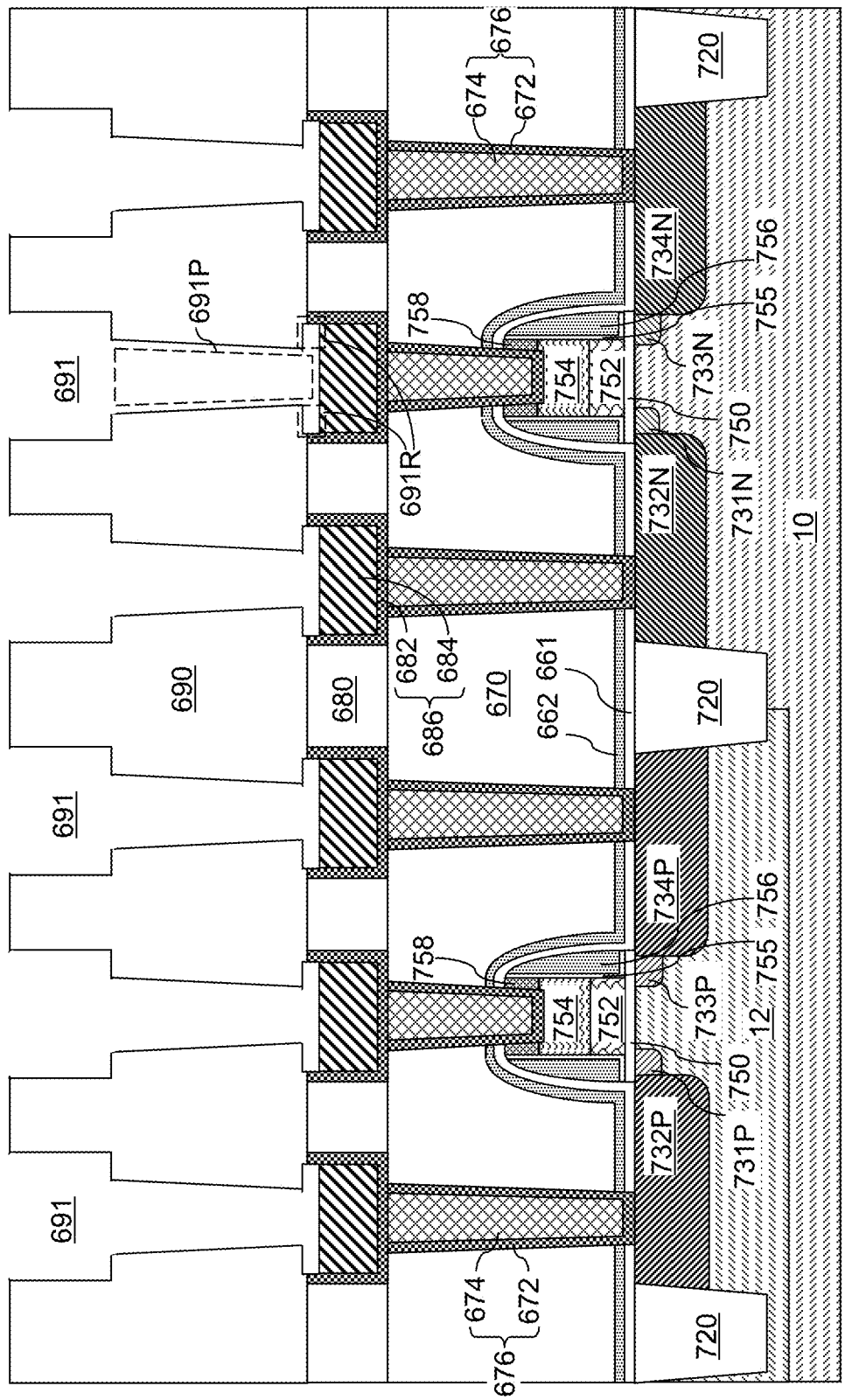
FIG. 6 is a vertical cross-sectional view of the first region of the exemplary structure after removal of the metal oxide plates according to first embodiment of the present disclosure.

Referring to FIG. 6, the metal oxide plates 687 are removed selective to the dielectric material of the second dielectric material layer 690 and selective to the materials of the first metal interconnect structures 686 (i.e., selective to the metallic materials of the first metallic nitride liners 682 and the first metallic fill material portions 684) employing a selective etch process. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The selective etch process can be an isotropic etch process, which may be an isotropic dry etch process (such as a chemical dry etch process) or a wet etch process. In one embodiment, removal of the metal oxide plates 687 selective to the first metal interconnect structures 686 and the second dielectric material layer 690 can be performed by an isotropic wet etch process. The etchant for the isotropic wet etch process can be selected depending on the metal oxide material of the metal oxide plates 687 as long as etch selectivity greater than 2, and preferably greater than 4, such as greater than 6, can be provided by the etchant. For example, if the metal oxide plates 687 consists essentially of tungsten oxide, a wet etch process employing hot trimethyl-2 hydroxyethyl ammonium hydroxide ("hot TMY") may be employed to etch tungsten oxide selective to tungsten, a metallic nitride material of the first metallic nitride liners 682, and the second dielectric material layer 690. Alternatively, other isotropic etchants such as tetramethyl ammonium hydroxide (TMAH), ammonium hydroxide, or other metal oxide etchants may be employed to etch metal oxide material of the metal oxide plates 687, which can include an oxide of a metal element such as tungsten oxide, copper oxide, aluminum oxide, ruthenium oxide, cobalt oxide, or molybdenum oxide Each second cavity 691 can be laterally expanded by the volume from which an underlying metal oxide plate 687 is removed. Each expanded second cavity 691 includes a pillar cavity 691P laterally bounded by straight sidewalls and a recess cavity 691R adjoined to the pillar cavity 691P and is laterally recessed outward from the sidewall(s) of the pillar cavity 691P. The recess cavity 691R can be an annular cavity that is laterally bounded by inner sidewalls of a first metallic nitride liner 692.

Figure 7:
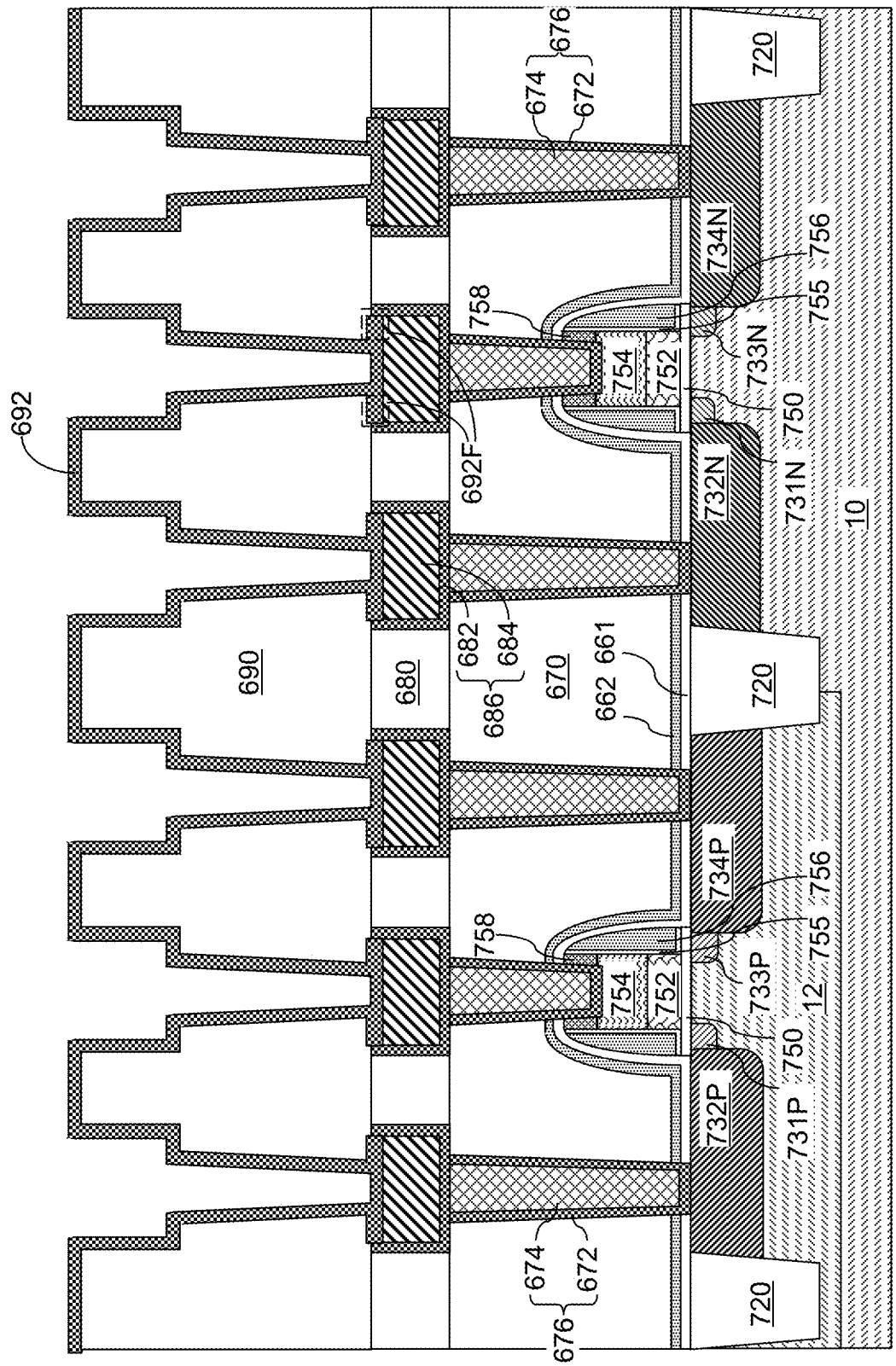
FIG. 7 is a vertical cross-sectional view of the first region of the exemplary structure after formation of a second metallic nitride liner according to first embodiment of the present disclosure.

Referring to FIG. 7, a second conductive metal nitride material is deposited in the second cavities 691 on the physically exposed surfaces of the first metallic nitride liners 682, the first metallic fill material portions 684, and the second dielectric material layer 690 to form a continuous conductive metal nitride material layer, which is herein referred to as a second metallic nitride liner 692. The second conductive metal nitride material can be deposited on all physically exposed surfaces of the expanded second cavities 691 including bottom surfaces of the second dielectric material layer 690 that overlie each recess cavity 691R. In one embodiment, the second conductive metal nitride material can be deposited by a conformal deposition process such as chemical vapor deposition or atomic layer deposition.

The second metallic nitride liner 692 can comprise, and/or consist essentially of, at least one conductive metal nitride material selected from WN, TiN, and TaN. Each of the recess cavities 691R within the second cavities 691 can be completely filled within the second metallic nitride liner 692.

In one embodiment, the second metallic nitride liner 692 can be deposited by a conformal deposition process such that the thickness of the deposited second conductive metallic nitride material is uniform throughout (unless geometrically constrained by the height of the recess cavities 691R) and sufficient to completely fill the recess cavities 691R. In one embodiment, the height of the recess cavities 691R can be less than twice the thickness of the deposited second conductive metallic nitride material deposited on the sidewalls of the pillar cavities 691P of the second cavities 691, and each recess cavity 691R can be completely filled with the second conductive metallic nitride material. Each portion of the second metallic nitride liner 692 filling a recess cavity 691R is herein referred to as a foot portion 692F of the second metallic nitride liner 692, or a second metallic nitride liner foot portion. In this case, the thickness of the second metallic nitride liner 692 on a sidewall of each pillar cavity 691P is greater than one half of the height of each recess cavity 691R. The height of each recess cavity 691R can be in a range from 0.8 nm to 6 nm such as from 1.2 nm to 4 nm, although lesser and greater thicknesses can also be employed. The thickness of the second metallic nitride liner 692 can be in a range from 1 nm to 10 nm such as from 1.5 nm to 4 nm, although lesser and greater thicknesses can also be employed.

Figure 8:
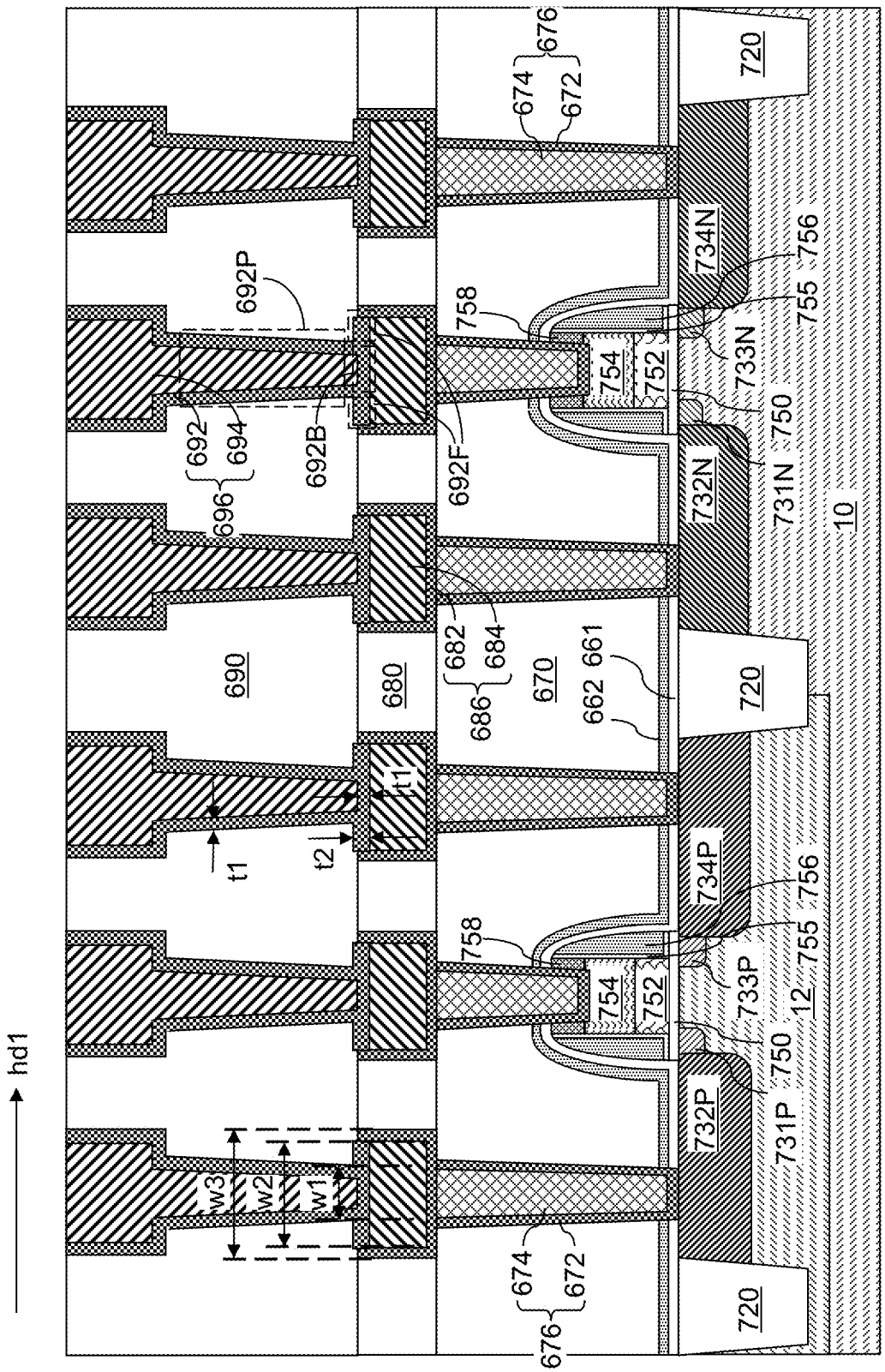
FIG. 8 is a vertical cross-sectional view of the exemplary structure after formation of second metal interconnect structures according to first embodiment of the present disclosure.

Referring to FIG. 8, a second metallic fill material can be deposited in remaining volumes of the expanded second cavity 691. The second metallic fill material can comprise, and/or consist essentially of, at least one element selected from tungsten, copper, aluminum, ruthenium, and cobalt. The second metallic fill material can be deposited by electroplating, electroless plating, physical vapor deposition, chemical vapor deposition, or a combination thereof. Excess portions of the second metallic fill material and the second conductive metallic nitride material can be removed from above a horizontal plane including the top surface of the second dielectric material layer by a planarization process, which can employ chemical mechanical planarization. Each remaining portion of the second metallic fill material constitutes a second metallic fill material portion 694. The second metallic nitride liner 692 is divided into multiple discrete metallic nitride liners 692 located within a respective one of the expanded second cavities 691. Each contiguous combination of a second metallic nitride liner 692 and a second metallic fill material portion 694 constitutes a second metal interconnect structure (692, 694).

Each second metal interconnect structure (692, 694) is embedded within the second dielectric material layer 690. Each second metal interconnect structure (692, 694) comprises a second metallic nitride liner 692 comprising the second conductive metal nitride and a second metallic fill material portion 694 comprising the second metallic fill material. Each second metallic nitride liner 692 can include a bottom portion 692B, a foot portion 692F, and a pillar portion 692P. The bottom portion 692B can be located between a bottom surface of the second metallic fill material portion 694 within the second metal interconnect structure (692, 694) that contains the bottom portion 692B and a center region of the top surface of an underlying first metallic fill material portion 684. The foot portion 692F fills a respective recess cavity 691R and contacts a peripheral region of the top surface of the underlying first metallic fill material portion 684. The pillar portion 692P has a generally cylindrical configuration and overlies the boundary between the bottom portion 692B and the foot portion 692F.

The bottom portion 692B has a first thickness t1, which can be the same as the lateral thickness of the second metallic nitride liner 692 within the pillar portion 692P, i.e., a portion of the second metallic nitride liner 692 that contacts a sidewall of the second metallic fill material portion 694. The foot portion 692F has a second thickness t2, which may be less than, equal to, or greater than, the first thickness. FIG. 8 illustrates a configuration in which the second thickness t2 is less than the first thickness t1.

Figure 9:
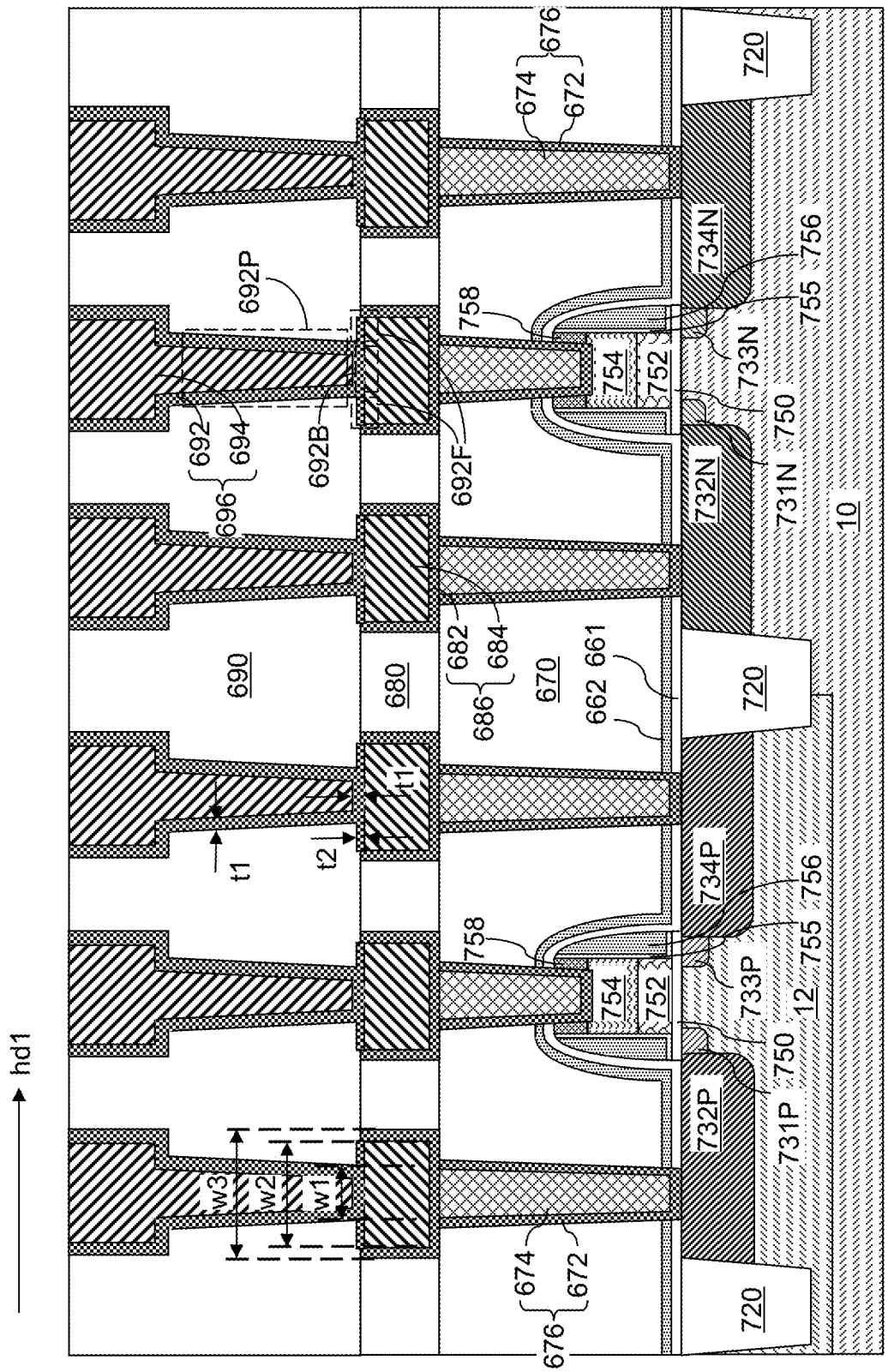
FIG. 9 is a vertical cross-sectional view of an alternative embodiment of the exemplary structure after formation of second metal interconnect structures according to first embodiment of the present disclosure.

Referring to FIG. 9, an alternative configuration of the exemplary structure is illustrated, in which the second thickness is greater than the first thickness t1. Additional metal interconnect structures and/or semiconductor devices can be formed over the exemplary structures illustrated in FIGS. 8 and 9. In one embodiment, additional dielectric material layers and additional metal interconnect structures and a three-dimensional memory array can be subsequently formed over the exemplary structures illustrated in FIGS. 8 and 9.

Figure 10A:
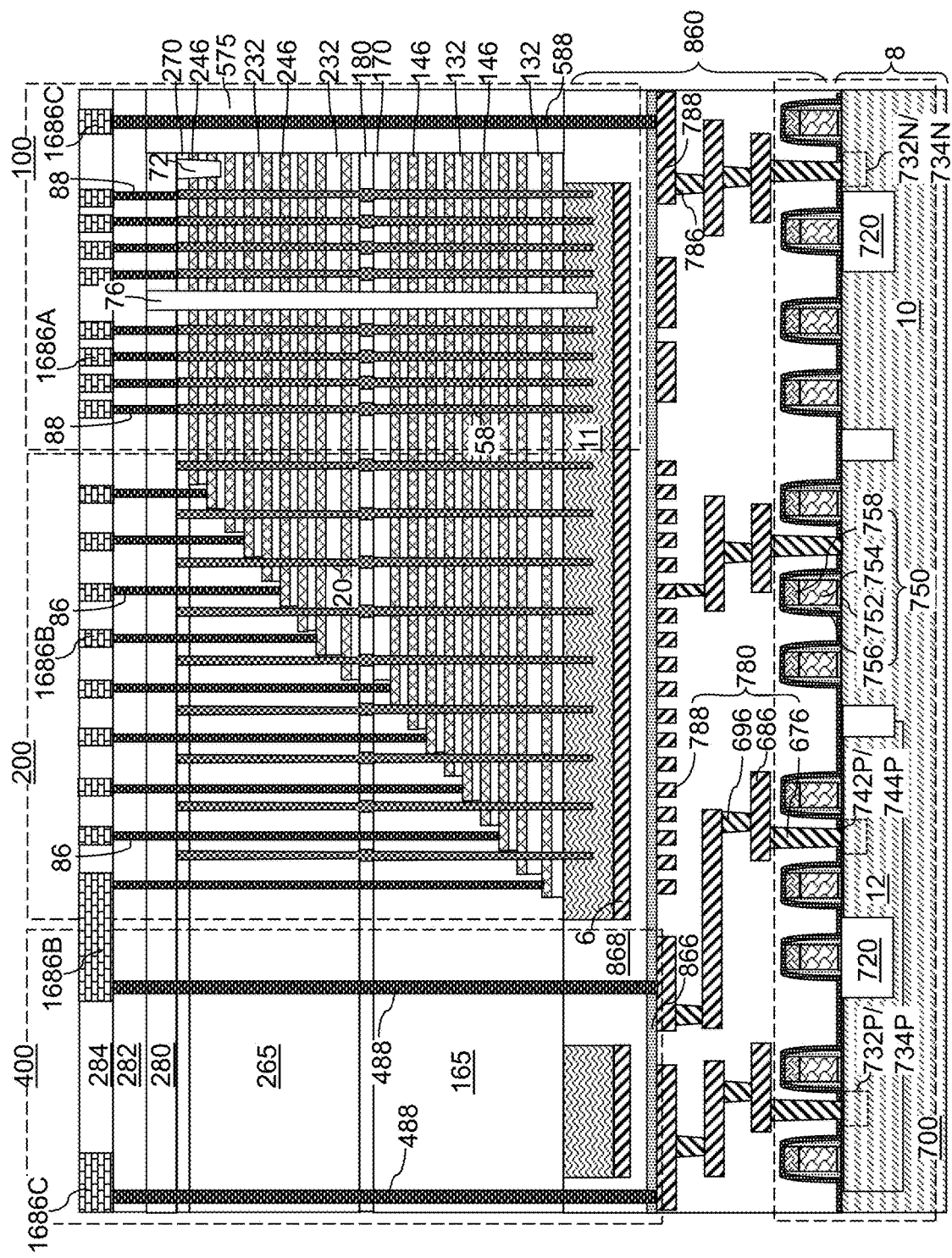
FIGS. 10A and 10B are vertical cross-sectional views of the exemplary structure after formation of a three-dimensional array of memory elements thereupon according to the first and second embodiments of the present disclosure.
Figure 10B:
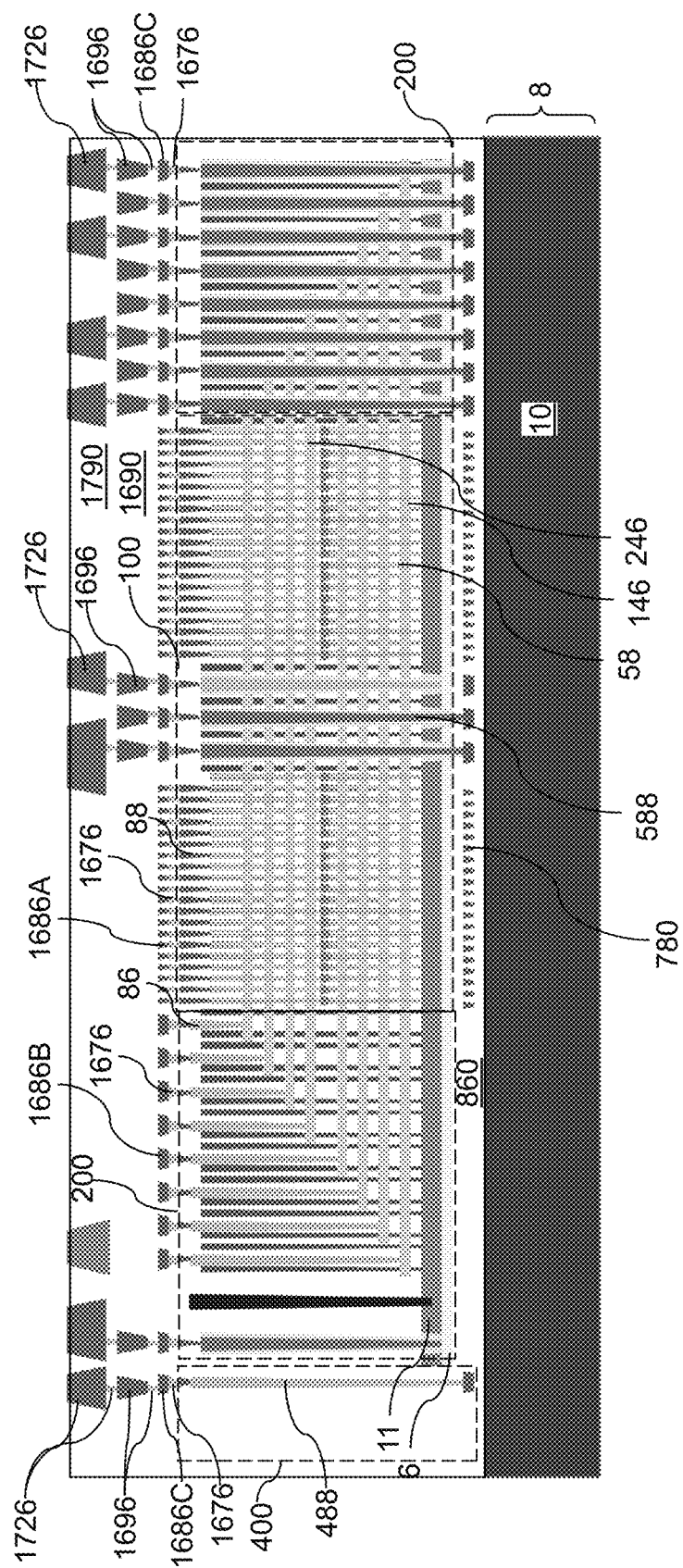

Referring to FIGS. 10A and 10B, the exemplary structure is illustrated after formation of a three-dimensional memory array over the field effect transistors. The various field effect transistors on the semiconductor substrate 8 containing the substrate semiconductor layer 10 and at least one doped well 12 can include multiple instances of the p-type field effect transistors 110 and multiple instances of the n-type field effect transistors 210 described above.

Additional dielectric material layers can be formed over the exemplary structure. The dielectric liners (661, 662), the planarization dielectric layer 670, the first dielectric material layer 680, the second dielectric material layers 690, and the additional dielectric layers are herein collectively referred to as lower-level dielectric material layers 860. The lower-level dielectric material layers 860 can include a diffusion barrier dielectric layer 866 such as a silicon nitride layer, and a dielectric matrix layer 868 that overlies the diffusion barrier dielectric layer 866 and embeds source-level material layers 11, which include semiconductor material layers.

Lower-level metal interconnect structures 780 can be formed within lower-level dielectric material layers 860 level by level. The lower-level metal interconnect structures 780 can include the various contact via structures 676, various first metal interconnect structures 686, various second metal interconnect structures 696, various additional via structures 786, and various additional metal line structures 788.

An optional layer of a metallic material and a layer of a semiconductor material can be deposited over, or within patterned recesses of, the dielectric matrix layer 868, and is lithographically patterned to provide an optional conductive plate layer 6 and source-level material layers 11. At least one alternating stack of insulating layers (132, 232) and spacer material layers can be formed and patterned to form stepped surfaces in a staircase region 200. A memory array region 100, in which each of the at least one alternating stack includes each layer therein, is provided adjacent to the staircase region. The spacer material layers can be formed as electrically conductive layers (146, 246), or can be formed as sacrificial material layers and can be subsequently replaced with electrically conductive layers (146, 246). For example, the at least one alternating stack can include a first alternating stack of first insulating layers 132 and first electrically conductive layers 146 and a second alternating stack of second insulating layers 232 and second electrically conductive layers 246. Retro-stepped dielectric material portions (165, 265) can be formed over the stepped surfaces. For example, a first retro-stepped dielectric material portion 165 can be formed over the first stepped surfaces of the first alternating stack (132, 146), and a second retro-stepped dielectric material portion 265 can be formed over the second stepped surfaces of the second alternating stack (232, 246). Intermediate dielectric material layers can be formed as needed. For example, the intermediate dielectric material layers can include a first insulating cap layer 170, an inter-tier dielectric layer 180, and a second insulating cap layer 270. Drain-select-level isolation structures 72 can be formed as needed.

Memory openings are formed through each layer in the at least one alternating stack (132, 146, 232, 246) in the memory array region 100, and are filled within memory opening fill structures 58. Each memory opening fill structure 58 includes a memory stack structure. Each memory stack structure can include a memory film and a vertical semiconductor channel laterally surrounded by the memory film. For example, each memory film can include a blocking dielectric, a charge storage layer, and a tunneling dielectric. Support openings in the staircase region 200 are filled with support pillar structures 20 which have the same composition and structure as the memory opening fill structures 58. Backside trenches can be formed through the at least one alternating stack (132, 146, 232, 246) to divide the at least one alternating stack (132, 146, 232, 246) into multiple memory blocks that are laterally spaced apart and electrically isolated among one another. A dielectric wall structure 76 can be formed within each backside trench. Dielectric pillar structures 575 can be optionally formed in the memory array region 100.

Various contact-level dielectric layers (280, 282) can be formed over the at least one alternating stack (132, 146, 232, 246). The various contact-level dielectric layers (280, 282) can include a first contact-level dielectric layer 280 and a second contact-level dielectric layer 282. Various upper-level contact via structures can be formed through the contact-level dielectric layers (280, 282) and underlying dielectric material portions. The upper-level contact via structures can include staircase region contact via structures 86 that contact a respective one of the first and second electrically conductive layers (146, 246), drain contact via structures 88 that contact a respective drain region (not expressly shown) at an upper end of an underlying memory stack structure in the memory opening fill structures 58, through-memory-level peripheral contact via structures 488 that contact a respective one of the lower-level metal interconnect structures 780 in a peripheral contact region 400, and through-memory-level array-region contact via structures 588 that extend through a respective dielectric pillar structures 575 and contact a respective one of the lower-level metal interconnect structures 780 in the memory array region 100.

A line-level dielectric layer 284 can be formed over the contact-level dielectric layers (280, 282). First metal interconnect structures 1686 (e.g., 1696A, 1696B and 1696C) can be formed in the line-level dielectric layer 284. The first metal interconnect structures can include bit lines 1686A that electrically contact a respective subset of the drain contact via structures 88, peripheral interconnection line structures 1686B that electrically contact at least one of the staircase region contact via structures 86 and optionally the through-memory-level peripheral contact via structures 488, and array-region interconnection line structures 1686C that electrically contact a respective one of through-memory-level peripheral contact via structures 488 or the through-memory-level array-region contact via structures 588.

As shown in FIG. 10B, the first metal interconnect structures 1686 can electrically contact the respective underlying contact via structures (86, 88, 488, 588) through a respective one of the contact via structures 1676. A second dielectric material layer 1690 is formed as a line and via level dielectric material layer. Second metal interconnect structures 1696 are formed through the second dielectric material layer 1690 to contact the respective first metal interconnect structures 1686. Optionally third metal interconnect structures 1726 are formed through an upper dielectric material layer 1790 to contact the respective second metal interconnect structures 1696.

In a second embodiment, the first and second metal interconnect structures of the first embodiment of present disclosure may be employed at any metal interconnect level above a three-dimensional memory device according to an embodiment of the present disclosure, in addition to or instead of being employed below the three-dimensional memory device. FIG. 11 illustrates an exemplary configuration in which the contact via structures 1676 which are formed through the first contact-level dielectric layer 280 and/or the second contact-level dielectric layer 282 correspond to the first contact via structures 676 of the first embodiment. The first contact-level dielectric layer 280 and/or the second contact-level dielectric layer 282 correspond to the first dielectric material layer 680. The first metal interconnect structures 1686 which are formed through the line-level dielectric layer 284 correspond to the first metal interconnect structures 686 of the first embodiment. The second dielectric material layer 1690 corresponds to the second dielectric material layer 690 of the first embodiment. The second metal interconnect structures 1696 correspond to the second metal interconnect structures 696 of the first embodiment. Other configurations of electrically conductive layers overlying the three-dimensional memory device (e.g., three dimensional NAND memory device) of the second embodiment can also correspond to the electrically conductive layers of the first embodiment.

As discussed above, the combination of at least one first metal interconnect structure (686, 1686) and at least one second metal interconnect structure (696, 1696) can be formed at any level within a metal interconnect assembly that employs at least two metal levels as known in the art. As such, the scope of the present invention should be interpreted as including any metal interconnect assembly including two or more adjacent metal levels in any known semiconductor device.

Referring to all drawings and according to various embodiments of the present disclosure, a structure is provided, which comprises a first metal interconnect structure (686, 1686) embedded within a first dielectric material layer (680, 284) overlying a substrate (8, 10, 12), wherein the first metal interconnect structure (686, 1686) comprises a first metallic nitride liner (682, 1682) comprising a first conductive metal nitride and a first metallic fill material portion (684, 1684) embedded within the first metallic nitride liner. A second metal interconnect structure (696, 1696) is embedded within a second dielectric material layer (690, 1690) overlying the first dielectric material layer (680, 284). The second metal interconnect structure (696, 1696) comprises a second metallic nitride liner (692, 1692) comprising a second conductive metal nitride and a second metallic fill material portion (694, 1694) embedded within the second metallic nitride liner. The second metal interconnect structure (696, 1696) comprises a pillar portion (692P, 1692P) having a straight sidewall and a foot portion (692F, 1692F) adjoined to a bottom periphery of the pillar portion and laterally protruding from the bottom periphery of the pillar portion.

In one embodiment, the straight sidewall extends diagonally (e.g., at an angle greater than zero and less than 90 degrees) with respect to a top surface of the substrate.

In one embodiment, the entirety of surfaces of the first metallic fill material portion (684, 1684) is in direct contact with a respective portion of surfaces of the first metallic nitride liner (682, 1682) and the second metallic nitride liner (692, 1692). In one embodiment, the entirety of a bottom periphery of the second metallic nitride liner (692, 1692) is in direct contact with inner sidewalls of the first metallic nitride liner (682, 1682).

In one embodiment, a top surface of the foot portion (692F, 1692F) of the second metallic nitride liner (692, 1692) is located above a horizontal plane including a top surface of the first dielectric material layer (680, 284), and an interface between the second metallic nitride liner (692, 1692) and the first metallic fill material portion (684, 1684) is located below the horizontal plane including the top surface of the first dielectric material layer (680, 284). In one embodiment, the entirety of the interface between the second metallic nitride liner (692, 1692) and the first metallic fill material portion (684, 1684) is located within another horizontal plane that is located below the horizontal plane including the top surface of the first dielectric material layer (680, 284).

In one embodiment, the bottom periphery of the pillar portion (692P, 1692) has a first width w1 along a first horizontal direction h1 (which can be within the vertical plane of the cross-sectional view of FIG. 8, FIG. 9 or FIG. 11); and the foot portion (692F, 1692F) has a second width w2 along the first horizontal direction that is greater than the first width w1. In one embodiment, a topmost portion of the first metal interconnect structure (686, 1686) has a third width w3 along the first horizontal direction; and the third width w3 is greater than the second width w2 by twice the thickness of the first metallic nitride liner (682, 1682).

In one embodiment, a region of the second metallic nitride liner (692, 1692) located within the pillar portion (692P, 1692P) has a first thickness t1; and a region of the second metallic nitride liner (692, 1692) located within the foot portion (692F, 1692F) has a second thickness t2 that is different from the first thickness t1. In one embodiment, a region comprising a base portion (692B, 1692B) of the second metallic nitride liner (692, 1692) contacting the first metal interconnect structure (686, 1686) and laterally encircled by the foot portion (692F, 1692F) has the first thickness t1.

In one embodiment, the foot portion (692F, 1692F) consists of a metallic nitride material selected from TiN, TaN, and WN. In one embodiment, the foot portion laterally extends horizontally outward from each point of the bottom periphery of the pillar portion (692P, 1692P).

In one embodiment, each of the first metallic nitride liner (682, 1682) and the second metallic nitride liner (692, 1692) consists essentially of at least one conductive metal nitride material selected from WN, TiN, and TaN, and each of the first metallic fill material portion (684, 1684) and the second metallic fill material portion (694, 1694) consists essentially of a single metallic element or an alloy of at least two metallic elements.

In one embodiment, the structure further comprises a three-dimensional NAND memory device located between the substrate (8, 10, 12) and the first dielectric material layer (284). The three-dimensional NAND memory device comprises an alternating stack of insulating layers (132, 232) and word lines (146, 246), and memory opening fill structures 58 each comprising a memory film, a semiconductor channel and a drain region extending through the alternating stack.

In one embodiment, the structure comprises a field effect transistor (110 or 210) located on a top surface of the substrate (10, 12), wherein the first dielectric material layer 680 overlies the top surface of the semiconductor substrate (10, 12), the first metal interconnect structure 686 is electrically shorted to a node of the field effect transistor (110 or 210), and the first metallic fill material portion 684 consists essentially of tungsten.

The foot portion (692F, 1692F) of the second metallic nitride liner (692, 1692) increases the contact area between the first metal interconnect structure (686, 1686) and the second metal interconnect structure (696, 1696) to the entire top surface area of the underlying first metallic fill material portion (684, 1684). By increasing the contact area between the first metal interconnect structure and the second metal interconnect structure above the area enclosed by the periphery of the bottom end of the pillar portion (692P, 1692P) of the second metal interconnect structure (696, 1696), the contact resistance between the first metal interconnect structure and the second metal interconnect structure can be reduced compared with prior art configurations that do not include any foot portion (692F, 1692F) variations in the thickness of a metallic nitride liner, or a recessed top surface of an underlying metallic fill material portion. The configuration of the present disclosure that includes a foot portion (692F, 1692F) can be employed at multiple levels of a metal interconnect assembly, and/or at each level of the metal interconnect assembly to reduce contact resistance at various levels.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

The invention claimed is:

1. A structure comprising:
a first metal interconnect structure embedded within a first dielectric material layer overlying a substrate, wherein the first metal interconnect structure comprises a first metallic nitride liner comprising a first conductive metal nitride and a first metallic fill material portion embedded within the first metallic nitride liner; and
a second metal interconnect structure embedded within a second dielectric material layer overlying the first dielectric material layer, wherein the second metal interconnect structure comprises a second metallic nitride liner comprising a second conductive metal nitride and a second metallic fill material portion embedded within the second metallic nitride liner,
wherein:
the second metallic nitride liner comprises a pillar portion having a straight sidewall and a foot portion adjoined to a bottom periphery of the pillar portion and laterally protruding from the bottom periphery of the pillar portion;
the straight sidewall extends diagonally with respect to a top surface of the substrate; and
an entirety of surfaces of the first metallic fill material portion is in direct contact with a respective portion of surfaces of the first metallic nitride liner and the second metallic nitride liner.

2. The structure of claim 1, wherein:
the bottom periphery of the pillar portion has a first width along a first horizontal direction;
the foot portion has a second width along the first horizontal direction that is greater than the first width.

3. The structure of claim 2, wherein:
a topmost portion of the first metal interconnect structure has a third width along the first horizontal direction; and
the third width is greater than the second width by twice a thickness of the first metallic nitride liner.

4. The structure of claim 1, wherein:
a region of the second metallic nitride liner located within the pillar portion has a first thickness; and
a region of the second metallic nitride liner located within the foot portion has a second thickness that is different from the first thickness.

5. The structure of claim 4, wherein a region of the second metallic nitride liner contacting the first metal interconnect structure and laterally encircled by the foot portion has the first thickness.

6. The structure of claim 1, wherein the foot portion consists of a metal nitride material selected from TiN, TaN, and WN.

7. The structure of claim 1, further comprising a three-dimensional NAND memory device located between the substrate and the first dielectric material layer.

8. The structure of claim 7, wherein the three-dimensional NAND memory device comprises:
an alternating stack of insulating layers and word lines; and
memory opening fill structures each comprising a memory film, a semiconductor channel and a drain region extending through the alternating stack.

9. The structure of claim 1, further comprising a field effect transistor located on a top surface of the substrate, wherein:
the first dielectric material layer overlies the top surface of the substrate;
the first metal interconnect structure is electrically shorted to a node of the field effect transistor; and
each of the first and second metallic nitride liners consists essentially of at least one conductive metal nitride material selected from WN, TiN, and TaN; and the first metallic fill material portion consists essentially of tungsten.

10. A structure comprising:
a first metal interconnect structure embedded within a first dielectric material layer overlying a substrate, wherein the first metal interconnect structure comprises a first metallic nitride liner comprising a first conductive metal nitride and a first metallic fill material portion embedded within the first metallic nitride liner; and
a second metal interconnect structure embedded within a second dielectric material layer overlying the first dielectric material layer, wherein the second metal interconnect structure comprises a second metallic nitride liner comprising a second conductive metal nitride and a second metallic fill material portion embedded within the second metallic nitride liner,
wherein the second metallic nitride liner comprises a pillar portion having a straight sidewall and a foot portion adjoined to a bottom periphery of the pillar portion and laterally protruding from the bottom periphery of the pillar portion; and
wherein an entirety of a bottom periphery of the second metallic nitride liner is in direct contact with inner sidewalls of the first metallic nitride liner.

11. A structure comprising:
a first metal interconnect structure embedded within a first dielectric material layer overlying a substrate, wherein the first metal interconnect structure comprises a first metallic nitride liner comprising a first conductive metal nitride and a first metallic fill material portion embedded within the first metallic nitride liner; and
a second metal interconnect structure embedded within a second dielectric material layer overlying the first dielectric material layer, wherein the second metal interconnect structure comprises a second metallic nitride liner comprising a second conductive metal nitride and a second metallic fill material portion embedded within the second metallic nitride liner,
wherein:
the second metallic nitride liner comprises a pillar portion having a straight sidewall and a foot portion adjoined to a bottom periphery of the pillar portion and laterally protruding from the bottom periphery of the pillar portion;

a top surface of the foot portion of the second metallic nitride liner is located above a horizontal plane including a top surface of the first dielectric material layer; and an interface between the second metallic nitride liner and the first metallic fill material portion is located below the horizontal plane including the top surface of the first dielectric material layer.

12. The structure of claim 11, wherein:

wherein the foot laterally extends horizontally outward from each point of the bottom periphery of the pillar portion; and an entirety of the interface between the second metallic nitride liner and the first metallic fill material portion is located within another horizontal plane.

* * * * *